United States Patent [19]

Murashita et al.

[11] 4,263,491

[45] Apr. 21, 1981

[54] METHOD FOR CHECKING ELECTRIC CONTACTS OF AN ENCLOSED-TYPE SWITCHING DEVICE AND AN AUXILIARY APPARATUS FOR USE WITH THE SWITCHING DEVICE TO USE THE METHOD

[75] Inventors: Masaki Murashita, Hitachi; Seizo Nakano, Mito; Hiroshi Itoh; Shigeo Shiono, both of Hitachi; Takeshi Takahashi, Hitachiota, all of Japan

[73] Assignee: Hitachi, Ltd., Tokyo, Japan

[21] Appl. No.: 889,535

[22] Filed: Mar. 23, 1978

[30] Foreign Application Priority Data

Mar. 31, 1977 [JP] Japan .................................. 52-35351

[51] Int. Cl.³ ...................... H01H 9/00; H01H 33/12
[52] U.S. Cl. ................................ 200/146 R; 200/308
[58] Field of Search ........... 200/146 R, 147 R, 148 A, 200/148 R, 308, 50 AA

[56] References Cited

U.S. PATENT DOCUMENTS

| | | | |
|---|---|---|---|
| 2,777,024 | 1/1957 | West | 200/50 AA |
| 2,905,795 | 9/1959 | Platz | 200/308 |
| 3,943,777 | 3/1976 | Kishi et al. | 200/82 B |
| 4,009,458 | 2/1977 | Kishi et al. | 200/148 A |
| 4,011,424 | 3/1977 | Ericson et al. | 200/308 |

*Primary Examiner*—James R. Scott
*Attorney, Agent, or Firm*—Craig and Antonelli

[57] ABSTRACT

In an enclosed-type switching device having at least a pair of electric contacts, a method for checking the contacts without visual inspection wherein with the contacts closed, the resistance value between outer terminals connected to the contacts is measured and compared with a reference resistance value, so that the result of comparison is used to determine the degree of damage of the contacts. Also disclosed is an auxiliary apparatus for use with an enclosed-type switching device to facilitate application of the above-mentioned method, especially when the switching device is equipped with a plurality of parallel-connected sequentially closed or opened contact pairs. The auxiliary apparatus is arranged to interrupt the sequential operation of the contact pairs so that the resistance is measured during the interruption of the operation.

6 Claims, 5 Drawing Figures

4,263,491

METHOD FOR CHECKING ELECTRIC CONTACTS OF AN ENCLOSED-TYPE SWITCHING DEVICE AND AN AUXILIARY APPARATUS FOR USE WITH THE SWITCHING DEVICE TO USE THE METHOD

BACKGROUND OF THE INVENTION

1. Field of the Invention

This invention relates to a method for checking the contacts of an enclosed type switching device including an air-blast circuit breaker, gas circuit breaker or the like, and an auxiliary apparatus for use with the switching device for application of the method.

2. Description of the Prior Art

In conventional methods, the electric contacts of the switching device are visually observed in order to check a degree of damage or deterioration thereof. In the case of an enclosed-type switching device such as an air-blast circuit breaker or gas circuit breaker, it is necessary to take off the partition walls or casings enclosing the contacts for visual inspection of the contacts and after completing the inspection, to assemble them again.

Especially in recent years, the increased voltage and capacity of the electric power transmission system has remarkably increased the short-circuit current at ground-faults or the like, thereby subjecting the contacts of the circuit breakers to a greater risk of damage when cutting off such a short-circuit current. It is thus required that the circuit breakers be inspected at regular intervals of time to exchange the contacts depending on the degree of damage.

In an enclosed-type circuit breaker in which the contacts are covered with partition walls or casing, it requires very troublesome and time-consuming work to check the degree of their damage. Also, since it is required to cut off the power supply during the work including removal of the partitions or casing, the working time must be as short as possible. Further, in order to minimize the time required for maintenance and inspection of the circuit breaker for saving maintenance labor, it is desirable to lengthen the time intervals between successive regular inspections on the one hand and to shorten the time required for each regular inspection on the other hand. In the case where the contacts are determined faulty as a result of the regular inspection, it is inevitable that the enclosed parts be dismantled in order to replace the contacts, while when the contacts are in good condition they need not be replaced. Therefore, if it is possible to detect the good condition of the contacts without visual inspection, it will eliminate the need of the labor-consuming work of dismantling and assembly of the enclosed parts, desirably resulting in a shorter time of power stoppage and an improved maintenance labor saving.

SUMMARY OF THE INVENTION

Accordingly, it is the primary object of the present invention to provide a method for checking the contacts of an enclosed-type switching device without dismantling the enclosed parts thereof.

According to the present invention, whether or not the contacts are required to be replaced is determined without dismantling the enclosed section of the enclosed-type switching device on the basis of our finding that the degree of damage of the contacts has a specific relationship with the change in the contact resistance between the contacts.

In an enclosed-type switching device with at least a pair of contacts for opening or closing a current circuit, the contacts are connected respectively to external connection terminals by electrical conductors passing through the enclosed parts of the switching device. To facilitate the dismantling and assembly of the switching device, the electrical conductor may include a plurality of circuit members electrically connected to each other end-to-end through pressure abutment between contacts provided at the ends of the respective circuit members. Such contacts are not opened once the switching device has been assembled and therefore, not subjected to any damage in operation so that they require no inspection. In the description below, only those contacts which are provided for opening or closing the current circuit in operation will be referred to as "contacts". According to the method of the present invention, changes in contact resistance of the contact pair are detected by measuring the resistance across the external terminals with the contacts closed, and the result of measurement is compared with a normal value measured beforehand for determining whether or not the contacts are in good condition.

In a switching device including a plurality of parallel-connected contact pairs sequentially opened or closed, the contact pairs are sequentially transferred from open to closed state. In each stage of transfer, the resistance between the external terminals is measured and compared with a normal value associated with that particular stage of transfer which is measured beforehand, for determining whether or not each of the plurality of contact pairs is in good condition.

Another object of the present invention is to provide an auxiliary apparatus for use with a switching device including a plurality of parallel-connected contacts pairs sequentially closed or opened, to facilitate the application of the method according to the present invention to such a switching device. The auxiliary apparatus is capable of suspending the transfer at any desired shape in the course of sequential operation of the contact pairs from open to closed state, so that the resistance between the external terminals is measured during the suspension.

DESCRIPTION OF THE PREFERRED EMBODIMENTS

Figure 1:
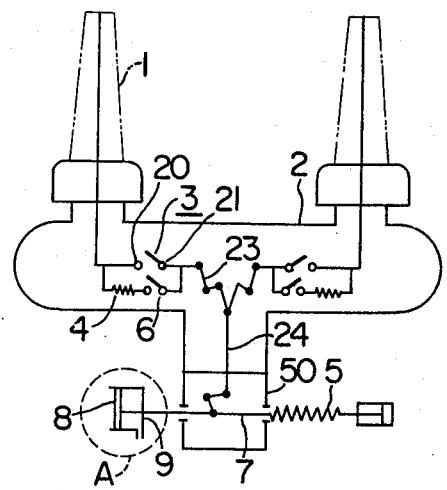
FIG. 1 is a diagram schematically showing the configuration of an enclosed-type switching device to which the present invention is applied.

The present invention will be described with reference to an enclosed-type switching device such as a circuit breaker used for cutting off a line current in a high-voltage large-power system, and in which the switching section including at least one contact pair is enclosed in a casing and the contacts are connected to the external terminals by electrical conductors passing through the casing.

In the case where the switching section comprises only a pair of main contacts adapted to open or close, the circuit breaker is first opened and then, after separating the breaker from power supply and load-side circuits, closed again to measure the resistance between the external terminals. The circuit breaker, which is normally connected to the power supply and the load-side circuit through disconnecting switches respectively, is easily separated from them by opening the disconnecting switches. The resistance value measured between the external terminals with the contacts closed under this condition is equal to the sum of the contact resistance of the main contacts and the resistance of the electrical conductors connecting the main contacts to the external terminals. The electrical conductors may include a contact pair incapable of being opened under the assembled state as mentioned above, which contact pair does not change in resistance in operation and is comparatively small in resistance value. In the case where the change of resistance, rather than the resistance value itself, is a matter of concern as in the present invention, the resistance measured between the external terminals may be considered as the contact resistance of the main contacts. The resistance value thus measured is compared with a reference resistance value measured in advace. If the difference exceeds a predetermined tolerable value of change, the contacts are determined to be faulty and are replaced.

Generally, the contacts of the circuit breaker are checked each time of cutting off a large current such as in a short-circuit fault. In the absence of such faults, they are not checked before the next regular inspection. Between regular inspections, however, a small current is sometimes cut off, with the result that the contact surface of the contacts is gradually deteriorated and the contact resistance thereof increases. The tolerable value of resistance change is, therefore, determined in such a manner that the short-circuit current may be cut off without fail in a short-circuit fault which may occur before the next regular inspection even though the contact resistance of the main contacts would gradually increase. Generally, a sufficient tolerable value is 10% of the normal contact resistance value. In a contact pair having a normal resistance value of 145 $\mu\Omega$, for instance, the contacts are regarded as good, if the measured resistance does not exceed 159 $\mu\Omega$. The resistance value may be measured by any well-known methods. Because of the small resistance value involved, however, the current-voltage method is preferable, in which a constant DC current A is made to flow in the switch circuit between external terminals while the voltage drop V between the terminals is measured. The resistance is thus determined from equation $R = V/A$.

Explanation was made above of the case in which the switching section includes one main contact pair. The present invention is also applicable to the construction in which a plurality of series connected main contact pairs are opened or closed simultaneously. In this case, the total value of the contact resistances of the series-connected contact pairs is measured, and the degree of variation or change in the total resistance value indicates good or bad condition of the contact pairs regardless of which contact pair is deteriorated.

The above-mentioned method may be applied to any type of circuit breaker including the magnetic circuit breaker, air-blast circuit breaker or gas circuit breaker. Especially, the present invention is advantageous in application to the gas circuit breaker with contacts enclosed in a casing filled with $SF_6$ gas, because the work of extraction and refilling of the gas is saved by inspection according to the method of the present invention.

With the recent trend to use higher voltage and larger capacity in electric power transmission systems, the gas circuit breaker or other breaker used for such a system has posed a problem of an initial surge, and in order to suppress the surge voltage, some breakers have a pre-making resistor circuit device connected in parallel to the breaker section including the main contacts. Other breakers include a resistance breaker section electrically connected in parallel to the main breaker section so that the cut off of the circuit is made while limiting the current by a resistor provided in the resistance breaker section.

The circuit breakers of these constructions may also be inspected by the method mentioned above. When the change in contact resistance exceeds a predetermined tolerable value, however, it is difficult to determine whether the abnormal change in contact resistance is caused by the impedance contact device such as the pre-making resistor device and the resistance breaker section or caused by the main breaker section.

Even if the partitions or casing are removed when the tolerable change value is exceeded by the measured contact resistance value, it is not easy to identify the faulty section because the impedance contact device of the circuit breakers of these types is generally contained in an insulated member.

Next, explanation will be made of an embodiment applied to the circuit breakers of the above-mentioned types. As described in detail, for example, in U.S. Pat. No. 4,009,458 issued Feb. 22, 1977 to Kishi et al, entitled "Puffer Type Gas Circuit Breaker", the circuit breakers of these types are so constructed that the parallel-connected main breaker section and the impedance contact device are sequentially opened or closed. For example, in a closing operation, the impedance contact device is first closed, followed by the closing of the main breaker section about 8 msec later. According to the present invention, the resistance between the external terminals is measured after closing only the impedance contact device, and again measured after the main breaker section is closed. By comparing the respective results of measurement with predetermined reference values, it is possible to determine which section is abnormal.

In these types of circuit breakers, however, the movable contacts of the impedance contact device and the main breaker section are driven by a common hydraulic drive unit and therefore it is impossible to close one contact while keeping the other contact open. For this reason, in order to apply the present invention to these types of circuit breakers, an auxiliary circuit-closing device for resistance measurement is provided to enable the suspension of the closing operation with one contact closed.

The schematic diagram of FIG. 1 shows a circuit breaker comprising a main breaker section and an impedance contact device electrically connected in parallel to the main breaker section as described above.

The main breaker section 3 for current interruption is arranged in the enclosed casing 2. $SF_6$ gas or like is used to insulate the breaker section 3 from the casing 2 and also as a medium to extinguish an arc on the current cut-off.

In view of the presence of the enclosed casing 2, the degree of damage of the contacts of the breaker section 3 cannot be visually checked from outside.

The breaker section 3 includes a fixed contact 20 and a movable contact 21 which is mechanically connected to a circuit-closing device 5 through a transmission device. The transmission device includes a link device 23, an insulated control rod 24 and a driving rod 7. The circuit-closing device 5 may include a spring connected to the driving rod 7 for urging the rod towards the right side in the figure.

The impedance contact device including a resistor 4 and resistor contacts 6 is electrically connected in parallel to the breaker section 3. Of the resistor contacts 6, the movable contact is mechanically connected to the transmission device.

A circuit-opening device for operating the breaker section 3 to open the circuit, is mechanically connected to the transmission device in such a manner as to be capable of moving the driving rod 7 to the left side against the force of the circuit-closing device 5. The circuit-opening device shown in the drawing includes a piston 8 connected to the driving rod 7 and associated with a cylinder 9. The closing operation is performed by a hydraulic pressure applied to the inside of the cylinder 9, which pressure urges the piston 8, hence, rod 7 leftward.

As described in detail in U.S. Pat. No. 4,009,458, upon actuation of the circuit-closing device by an electromagnetic device described later, the resistor contacts 6 are closed prior to closing of the main contacts of the breaker section 3. Upon actuation of the opening device, the resistor contacts 6 are opened prior to the opening of the breaker section 3.

Figure 2:
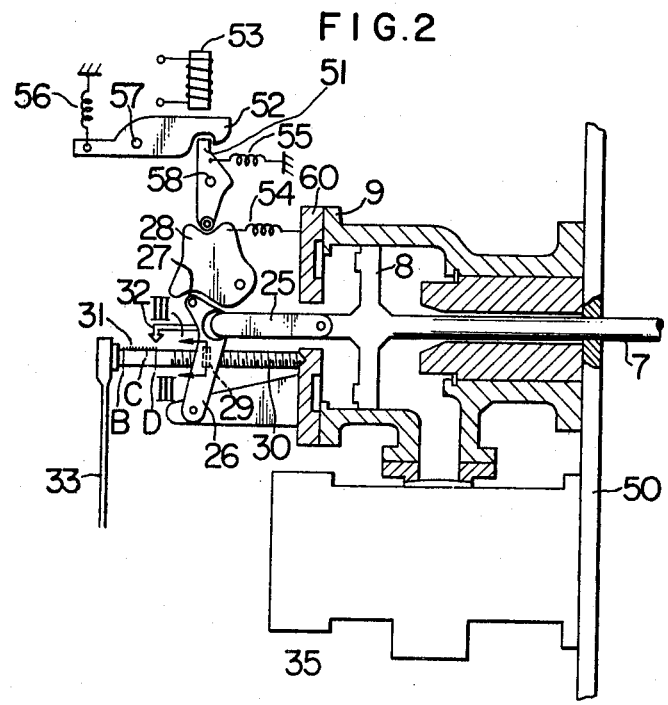
FIG. 2 is a diagram showing an auxiliary apparatus according to the present invention as mounted on a switching device.

The auxiliary circuit-closing device is provided in part A of FIG. 1, as its detail is shown in FIG. 2. The construction of FIG. 2, except for the auxiliary circuit-closing device, is substantially identical to that shown in U.S. Pat. No. 3,943,777 issued Mar. 16, 1976 to Tuneo Kishi et al, entitled "Operating Apparatus for Circuit Breaker".

The driving rod 7 which makes up a transmission device is coupled with the piston 8. The side of the piston 8 opposite to the driving rod 7 is coupled to the links 25 and 26. An end of the link 26 is rotatably supported, and the other end thereof is mounted with a roller 27. When the piston 8 reaches a position corresponding to the open position of the breaker section (the extreme left in the figure), the roller 27 engages the recess of the lever 28 and is kept in that position.

Upon energization of the electromagnetic device 53, the armature 52 is moved counterclockwise about the axis 57, so that the hook 51 disengages from the armature 52. The hook 51 rotates clockwise about the axis 58 by the force of spring 55, thus disengaging the lever 28 from the hook 51. The lever 28 rotates clockwise by a spring 54 and releases the roller 27, allowing the circuit-closing device 5 to move the rod 7 leftward, thereby performing the closing operation as described above. The auxiliary circuit-closing device including the rotary shaft 30 and the handle 33 thereof is mounted on the link 26.

Figure 3:
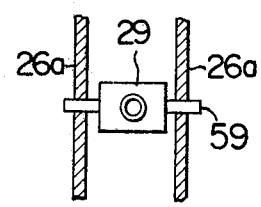
FIG. 3 is a sectional view of the mounting part of the auxiliary apparatus as taken along line III—III in FIG. 2.

The link 26, as shown in FIG. 3, comprises two plate members 26a, between which a nut 29 is mounted loosely and rotatably through a shaft 59. The rotary shaft 30 is removably fitted with its threaded portion screwed into the nut 29. When the handle 33 at the end of the rotary shaft 30 is rotated, the rotary shaft 30 moves longitudinally with respect to the nut 29.

The rotary shaft 30 moves rightward while being rotated, and when the right end of the rotary shaft 30 is brought into contact with the cylinder cover 60, rightward movement of the rotary shaft 30 is prevented. Therefore with further rotation of the handle 33, the nut 29 and accordingly the link 26 moves leftward, so that the rod 7 moves leftward together with the piston 8. When the piston 8 reaches the extreme left end, the circuit breaker is at its opening condition. An index 32 is fixed to the piston 8 or a member integrated therewith, while a position indication 31 is marked on the surface of the rotary shaft 30 at a part facing to the index 32. The position indication 31 may be lines B, C and D. The positions of lines B, C and D are so selected that when the index 32 points to line B, both the main contacts 3 and impedance contacts 6 are opened; when it points to line C, only the impedance contacts are closed; and when it points to D, both contacts are closed. These lines B, C and D may be replaced with equal effect by any appropriate marks including color marks, scale, etc.

This construction facilitates the implementation of the method of checking according to the present invention, as described below.

Before conducting the checking or inspection, the circuit breaker is opened and the disconnecting switches in series with the circuit breaker are cut off, thus separating the circuit breaker from the main system.

First, the rotary shaft 30 is screwed into the nut 29 in the open state of the circuit breaker, and then the lever 28 is disengaged from the roller 27 so that the piston 8 can move to the right by the force of the circuit-closing device 5 according to the movement of the link 26 towards the right. The rotary shaft 30 is then rotated by handle 33 and the piston 8 is moved leftward to the position where mark B of the indication means 31 is pointed to by index 32, as already described. Under this condition, both the main contacts and impedance contacts should be in open state. It should be preferable to ascertain this state by a tester or the like.

Figure 4:
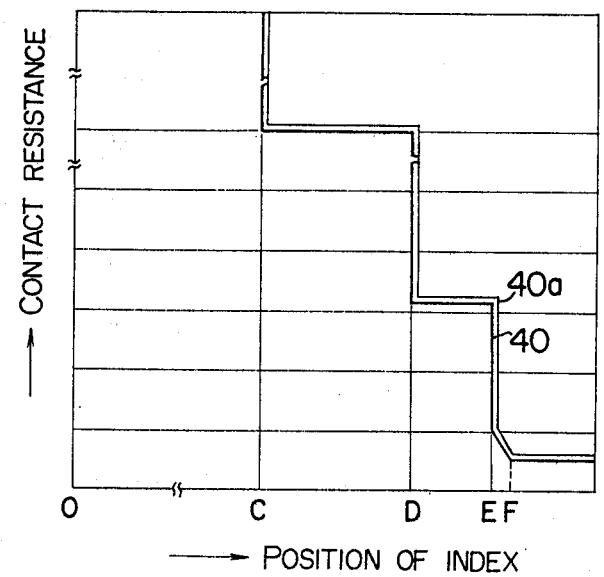
FIG. 4 is a graph showing the relation between reference resistance values and the positions in the sequential operation of the switching device for using the method according to the invention.

Next, the manual handle 33 is rotated to move the piston 8 rightward through the nut 29. When the index 32 comes to point to mark C, i.e., when the impedance contacts 6 are closed, the resistance between the external terminals at the heads of bushings 1 in FIG. 1 is measured. The measured value is compared with a reference value, as exemplarily shown in FIG. 4. In the case where the measured value does not exceed the tolerable upper limit 40a, then it is determined that no replacement is required, and the manual handle 33 is rotated further. If the resistance measurement exceeds the upper limit 40a, in contrast, it is determined that the impedance contacts 6 are required to be replaced. The upper limit is usually determined to be larger 10% than the reference value. In FIG. 4, the ordinate indicates the resistance values roughly by logarithmic scale.

A similar measurement is repeated at a position where the index 32 points to mark D. This completes the inspection of the contacts of the main breaker section.

Figure 5:
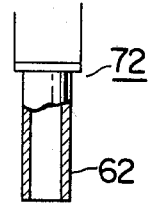
FIG. 5 is a diagram showing the construction of the main contact of a circuit breaker to which the present invention is applied.
Figure 5:
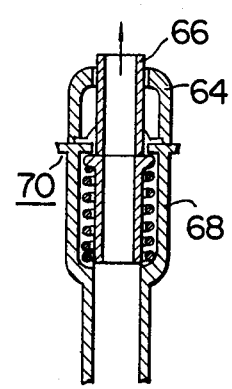

In some circuit breakers, the main breaker section may include an arc-breaking contacts, as well as a main current-conducting contact. An example of the main breaker section of such a type of circuit breaker is shown in FIG. 5. In ths figure, reference numeral 72 shows a fixed pole provided with a fixed contact 62. Numeral 70 shows a vertically-movable pole including a cylindrical support 68, a current-conducting cylindrical contact 64 integral with the support 68, and an arc-breaking contact 66 vertically movable within the cylindrical support 68 and contact 64. The movable pole 70 and the fixed pole 72 correspond to the movable contact 21 and the fixed contact 20 in FIG. 1 respectively. In a closing operation, as shown in FIG. 5 the movable pole 70 moves as a unit upward, so that the arc-breaking contact 66 first contacts with the fixed contact 62. Upon further upward movement of the movable pole 70, the arc-breaking contact 66 remains in contact with 62, while the current-conducting contact 64 together with the support 68 continue to move upward, with the result that the fixed contact 62 is inserted into the current-conducting contact 64 to provide a complete contact therebetween. In an opening operation, the processes are followed in reverse. In this type of circuit breaker, the contact resistance is preferably measured not only at the position where only the arc-breaking contact is closed but also at the position where both of the contacts are closed. For this purpose, the positional mark D of the auxiliary apparatus is selected at a position where only the arc-breaking contact is closed, and an additional mark E is attached to the position where the current-conducting contact is closed after further rightward movement of the piston 8. The contact resistance is measured at each of the positions where the index 32 points to marks D and E, respectively.

As easily understood, with movement of the current-conducting contact 64 from its initial position of contact where the contact 64 is just in contact with the contact 62 to its terminal position where the contact 64 is completely in contact with the contact 62, the contact area between the contact 64 and the contact 62 increases progressively and hence, the contact resistance between them progressively decreases. In FIG. 4, the position marked "E" corresponds to the initial position as mentioned above, while the position marked "F" corresponds to the terminal position. The reference resistance value should also decrease progressively from "E" to "F" as shown in FIG. 4.

The reference resistance value is determined in such a manner that at any short-circuit fault which may occur before the next regular inspection, the circuit breaker can reliably cut off the short-circuit current.

As described above, with the contacts sequentially closed, resistance is measured by way of external terminals at each stage of the sequential operation and the measured value is compared with a reference value. If the measurement deviates from the reference value by more than the tolerable variation range, the contact involved is determined faulty and replaced or repaired.

In the embodiment as above-mentioned, the position detector including the position mark 31 and the index 32 enables the position for measurement of contact resistance of the impedance contact device to be identified visually from outside, thereby facilitating the inspection work very much. The position detector is not limited to the above-mentioned construction, but may be arranged to provide either one of the position mark and the index on the transmission device mechanically connected to the movable contact 21 and the other on the fixed part of the switching device, respectively. The position detector is preferably located at a part exposed to the outside, although the same advantage is achieved by forming a peep hole without such exposure.

Without the position detector, the resistance between external terminals may be continually measured by operating the handle 33, and the results of measurement are compared with the references in FIG. 4 to attain the objects of the invention. In such a case, comparison is made with a measured value which does not change with movement of the index position in FIG. 4, for example, in the range from C to D or from D to E.

We claim:

1. In a system employing an auxiliary apparatus for use with an enclosed-type switching device of the type which comprises a casing, a pair of external terminals provided outside said casing to be connected to an associated electric power system, a switch section mounted in said casing and electrically connected to said external terminals, said switch section including a plurality of contact pairs, each pair connected between said external terminals and movable between a closing state where an electrical connection is provided between said external terminals through said each pair in the closing state and an open state where said electrical connection is cut-off, a movable member mechanically connected to said switch section and movable between first and second positions such that said contact pairs are successively actuated into their closing states when said movable member is moved from said first position to said second position and into their open states when said movable member is moved from said second position to said first position, and actuating means for actuating said movable member selectively to move from said first position to said second position or to move from said second position to said first position, the improvement of an auxiliary apparatus comprising, means removably mounted to said movable member for moving said movable member selectively from said first position to said second position or from said second position to said first position and selectively stopping said movable member at any position between said first and second positions.

2. An auxiliary apparatus according to claim 1, in which said movable member moving means comprises a threaded rotary rod removably and rotatably mounted into screw-engagement with a portion of said movable member so that said movable member is moved from one of its first and second positions toward the other position when said rod is rotated and a handle connected to said rod for manually rotating said rod.

3. An auxiliary apparatus according to claim 2, further comprising position indicating means for indicating a relative position of said movable member of said rotary rod, said indicating means comprising an index fixed to one of said movable member and said rotary rod and position marks marked on the other.

4. In a system for use with an enclosed-type switching device comprising two terminals, an enclosed switch section including a plurality of contact pairs connected in parallel between said terminals and each changeable from open to closed state, and control means including a movable member mechanically connected to said contact pairs and movable to cause said contact pairs to sequentially change from open to closed state, the improvement of an auxiliary apparatus comprising, movable member driving means removably mounted to said movable member and capable of moving said movable member along the same path as the path of movement thereof for the sequential change of the states of said contact pairs and of stopping said movable member selectively at any position of said path, said driving means including a rotary rod rotatably screwed to said movable member and having an end portion which is capable of being positionally fixed, and a handle for manually rotating said rotary rod, and means for detecting the position of said plurality of contact pairs including an index fixed to one of said rotary rod and said movable member and placed opposingly to part of the other of said rotary rod and said movable member and a plurality of position marks provided on said part of the other of said rotary rod and said movable member.

5. An auxiliary apparatus according to claim 3 or 4, in which said position marks are positioned such that when said index is opposed to one of said position marks, one of said contact pairs associated with said one position mark is closed.

6. An auxiliary apparatus according to claim 1 or 4, wherein said plurality of contact pairs include main contacts and arc-breaking contacts which are closed prior to closing of said main contacts in closing operation of said switching device.

* * * * *